US012610605B2

(12) United States Patent
Lydon-Nuhfer et al.

(10) Patent No.: US 12,610,605 B2
(45) Date of Patent: Apr. 21, 2026

(54) IC STRUCTURE WITH GATE ELECTRODE FULLY WITHIN V-SHAPED CAVITY

(71) Applicant: GlobalFoundries U.S. Inc., Malta, NY (US)

(72) Inventors: Megan Lydon-Nuhfer, Essex Junction, VT (US); Steven M. Shank, Jericho, VT (US); Aaron L. Vallett, Jericho, VT (US); Michel Abou-Khalil, Essex Junction, VT (US); Sarah A. McTaggart, Essex Junction, VT (US); Rajendran Krishnasamy, Essex Junction, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 645 days.

(21) Appl. No.: 18/059,186

(22) Filed: Nov. 28, 2022

(65) Prior Publication Data

US 2024/0178290 A1    May 30, 2024

(51) Int. Cl.
*H10D 64/27*        (2025.01)
*H10D 62/10*        (2025.01)
(Continued)

(52) U.S. Cl.
CPC ......... *H10D 64/518* (2025.01); *H10D 62/117* (2025.01); *H10D 62/151* (2025.01); *H10D 64/01* (2025.01); *H10D 64/015* (2025.01); *H10D 64/512* (2025.01); *H10D 64/661* (2025.01)

(58) Field of Classification Search
CPC ........ H01L 21/28008; H01L 21/28291; H10D 84/0135–0142; H10D 84/0172–0179; H10D 64/311–519; H10D 30/673–6736; H10D 64/66–693; H10D 30/0215;
(Continued)

(56) References Cited

U.S. PATENT DOCUMENTS 3,892,608 A * 7/1975 Kuhn ................ H01L 21/32134
                                                    257/E21.309
3,975,752 A * 8/1976 Nicolay ............... H10D 62/343
                                                    148/DIG. 115
(Continued)

OTHER PUBLICATIONS

European Search Report for corresponding EP Application No. 23201745.9-1212 dated Mar. 7, 2024, 11 pages.
(Continued)

*Primary Examiner* — Maliheh Malek
(74) *Attorney, Agent, or Firm* — Francois Pagette; Hoffman Warnick LLC

(57) ABSTRACT
An integrated circuit (IC) structure includes a V-shaped cavity in a semiconductor substrate. A source region and a drain region are on opposing sides of the V-shaped cavity. A gate structure includes a gate dielectric layer, spacers, and a gate electrode on the gate dielectric layer between the spacers. The gate structure is fully within the V-shaped cavity. The IC structure provides a switch that finds advantageous application as part of a low noise amplifier. The IC structure provides a smaller gate width, decreased capacitance, increased gain and increased radio frequency (RF) performance compared to planar devices or devices without the gate structure fully within V-shaped cavity.

18 Claims, 4 Drawing Sheets

(51) Int. Cl.
    *H10D 62/13*     (2025.01)
    *H10D 64/01*     (2025.01)
    *H10D 64/66*     (2025.01)

(58) Field of Classification Search
    CPC .. H10D 64/017; H10D 30/701; H10D 30/668;
        H10D 64/411; H10D 64/511; H10B
                51/00–50
    See application file for complete search history.

(56) References Cited

U.S. PATENT DOCUMENTS

| | | | | |
|---|---|---|---|---|
| 4,003,036 A | * | 1/1977 | Jenne | G11C 11/404 |
| | | | | 365/182 |
| 4,037,306 A | * | 7/1977 | Gutteridge | H01L 23/522 |
| | | | | 257/586 |
| 4,048,649 A | * | 9/1977 | Bohn | H10D 62/113 |
| | | | | 257/330 |
| 4,074,300 A | * | 2/1978 | Sakai | H10D 64/259 |
| | | | | 257/E29.255 |
| 4,084,175 A | | 4/1978 | Ouyang | |
| 4,109,270 A | * | 8/1978 | von Basse | H10D 30/63 |
| | | | | 365/182 |
| 4,116,720 A | * | 9/1978 | Vinson | H10D 30/63 |
| | | | | 257/337 |
| 4,119,996 A | * | 10/1978 | Jhabvala | H10D 84/856 |
| | | | | 257/334 |
| 4,194,283 A | * | 3/1980 | Hoffmann | H10D 62/151 |
| | | | | 257/296 |
| 4,225,879 A | * | 9/1980 | Vinson | H01L 21/033 |
| | | | | 257/E21.231 |
| 4,231,056 A | * | 10/1980 | Taylor | H10B 10/10 |
| | | | | 257/E27.041 |
| 4,250,519 A | * | 2/1981 | Mogi | H10B 12/34 |
| | | | | 257/302 |
| 4,268,537 A | * | 5/1981 | Goodman | H10D 64/027 |
| | | | | 257/E21.429 |
| 4,269,636 A | * | 5/1981 | Rivoli | H01L 21/76232 |
| | | | | 257/E21.549 |
| 4,272,302 A | * | 6/1981 | Jhabvala | H10D 30/60 |
| | | | | 257/E21.429 |
| 4,295,924 A | * | 10/1981 | Garnache | H10D 64/027 |
| | | | | 257/E21.429 |
| 4,316,203 A | * | 2/1982 | Tohgei | H10D 62/307 |
| | | | | 257/E29.054 |
| 4,326,332 A | * | 4/1982 | Kenney | H01L 21/76877 |
| | | | | 257/E21.585 |
| 4,338,620 A | * | 7/1982 | Kawabe | H01L 21/76202 |
| | | | | 257/E21.258 |
| 4,364,074 A | * | 12/1982 | Garnache | H10D 30/63 |
| | | | | 257/E21.585 |
| 4,409,609 A | * | 10/1983 | Fukuda | H01L 21/268 |
| | | | | 257/E23.152 |
| 4,468,414 A | * | 8/1984 | Van Vonno | H10D 1/47 |
| | | | | 257/536 |
| 4,503,449 A | * | 3/1985 | David | H10D 30/668 |
| | | | | 257/330 |
| 4,507,849 A | * | 4/1985 | Shinozaki | H01L 21/32134 |
| | | | | 257/E21.309 |
| 4,697,201 A | * | 9/1987 | Mihara | H10D 30/668 |
| | | | | 257/330 |
| 4,859,621 A | * | 8/1989 | Einthoven | H10D 30/637 |
| | | | | 438/271 |
| 4,914,050 A | * | 4/1990 | Shibata | H10D 62/021 |
| | | | | 257/E29.112 |
| 5,362,973 A | * | 11/1994 | Paoli | H01L 21/02546 |
| | | | | 257/E21.123 |
| 5,451,805 A | * | 9/1995 | Yang | H10D 30/66 |
| | | | | 257/341 |
| 5,466,616 A | * | 11/1995 | Yang | H10D 30/65 |
| | | | | 257/E29.256 |
| 5,600,168 A | * | 2/1997 | Lee | H10D 64/516 |
| | | | | 438/596 |
| 5,734,185 A | * | 3/1998 | Iguchi | H10D 30/027 |
| | | | | 257/E21.345 |
| 5,834,816 A | * | 11/1998 | Jang | H10D 30/0273 |
| | | | | 257/412 |
| 5,888,859 A | * | 3/1999 | Oku | H10D 64/64 |
| | | | | 257/E29.127 |
| 5,891,783 A | * | 4/1999 | Lin | H10D 64/671 |
| | | | | 438/525 |
| 5,905,283 A | * | 5/1999 | Kasai | H10D 84/038 |
| | | | | 257/334 |
| 5,923,046 A | * | 7/1999 | Tezuka | H10D 30/402 |
| | | | | 257/17 |
| 5,960,271 A | | 9/1999 | Wollesen et al. | |
| 6,018,179 A | * | 1/2000 | Gardner | H10D 30/0227 |
| | | | | 257/E21.252 |
| 6,064,107 A | * | 5/2000 | Yeh | H10D 64/679 |
| | | | | 257/E29.136 |
| 6,078,078 A | * | 6/2000 | Gardner | H10D 84/0126 |
| | | | | 257/E21.337 |
| 6,150,693 A | * | 11/2000 | Wollesen | H10D 30/60 |
| | | | | 257/334 |
| 6,380,027 B2 | * | 4/2002 | Furukawa | H10B 12/34 |
| | | | | 438/296 |
| 6,433,371 B1 | * | 8/2002 | Scholer | H10D 84/0188 |
| | | | | 257/E21.205 |
| 6,445,035 B1 | * | 9/2002 | Zeng | H10D 18/655 |
| | | | | 438/266 |
| 6,465,842 B2 | * | 10/2002 | Nishinohara | H10D 64/017 |
| | | | | 257/E21.429 |
| 6,661,066 B2 | * | 12/2003 | Kuroi | H01L 21/28114 |
| | | | | 257/365 |
| 6,720,617 B2 | * | 4/2004 | Einav | H10D 30/0321 |
| | | | | 257/329 |
| 7,045,867 B2 | * | 5/2006 | Dang | H10D 30/6715 |
| | | | | 257/E29.147 |
| 7,456,450 B2 | * | 11/2008 | Dyer | H10D 84/0167 |
| | | | | 257/E21.639 |
| 7,528,027 B1 | * | 5/2009 | Zhu | H10D 86/01 |
| | | | | 438/149 |
| 7,557,002 B2 | * | 7/2009 | Wells | H10D 62/371 |
| | | | | 438/243 |
| 7,671,383 B2 | * | 3/2010 | Hayashi | H10D 12/031 |
| | | | | 257/E21.093 |
| 7,687,852 B2 | | 3/2010 | Rouh et al. | |
| 7,804,130 B1 | * | 9/2010 | Fung | H10D 64/691 |
| | | | | 257/330 |
| 8,076,673 B2 | * | 12/2011 | Kreipl | H10B 20/00 |
| | | | | 257/209 |
| 8,076,735 B2 | * | 12/2011 | Lin | H10D 64/518 |
| | | | | 257/407 |
| 8,153,492 B2 | | 4/2012 | Fung | |
| 8,232,155 B2 | * | 7/2012 | Zhu | H10D 62/292 |
| | | | | 257/E21.249 |
| 8,603,868 B2 | * | 12/2013 | Guillorn | H10D 84/038 |
| | | | | 438/150 |
| 8,679,885 B1 | * | 3/2014 | Cheng | G01N 27/4145 |
| | | | | 438/49 |
| 9,048,254 B2 | * | 6/2015 | Chen | H10D 30/601 |
| RE45,702 E | * | 9/2015 | Omi | H10D 30/025 |
| 9,954,052 B2 | * | 4/2018 | Lee | H10D 84/0167 |
| 10,868,175 B2 | | 12/2020 | Kuang et al. | |
| 11,348,957 B2 | * | 5/2022 | Mun | H10F 39/80373 |
| 11,621,336 B2 | * | 4/2023 | Zang | H10F 39/18 |
| | | | | 257/330 |
| 11,650,381 B1 | * | 5/2023 | Polomoff | G02B 6/30 |
| | | | | 385/49 |
| 11,810,940 B2 | * | 11/2023 | Zang | H10F 39/802 |
| 12,002,883 B2 | * | 6/2024 | Yang | H10D 62/151 |
| 12,125,891 B2 | * | 10/2024 | Lu | H10D 84/038 |
| 2001/0045597 A1 | * | 11/2001 | Nishinohara | H10D 30/608 |
| | | | | 257/E29.267 |
| 2002/0000619 A1 | * | 1/2002 | Einav | H10D 30/0321 |
| | | | | 257/E21.412 |
| 2004/0119124 A1 | * | 6/2004 | Omi | H10D 30/63 |
| | | | | 257/E21.41 |

(56) References Cited

U.S. PATENT DOCUMENTS

| | | | |
|---|---|---|---|
| 2006/0124976 A1* | 6/2006 | Adkisson | H10D 64/027 |
| | | | 257/E21.429 |
| 2009/0242941 A1* | 10/2009 | Zhu | H10D 64/667 |
| | | | 257/E21.409 |
| 2010/0308407 A1* | 12/2010 | Kreipl | H10B 20/00 |
| | | | 257/356 |
| 2012/0091513 A1* | 4/2012 | Saimei | H10D 84/86 |
| | | | 438/584 |
| 2012/0161154 A1* | 6/2012 | Mimura | H10D 62/8325 |
| | | | 257/77 |
| 2015/0295066 A1 | 10/2015 | Grenouillet et al. | |
| 2017/0194476 A1* | 7/2017 | Brueck | H01L 21/0251 |
| 2017/0294508 A1* | 10/2017 | Hsu | H10D 62/116 |
| 2020/0235215 A1* | 7/2020 | Yamaguchi | H01L 23/4821 |
| 2020/0350403 A1* | 11/2020 | Basker | H10D 62/292 |
| 2022/0130886 A1* | 4/2022 | Zang | H10F 39/802 |
| 2022/0376068 A1* | 11/2022 | Zang | H10F 39/18 |
| 2023/0039408 A1* | 2/2023 | Huang | H10D 30/69 |
| 2023/0048355 A1* | 2/2023 | Nakata | H10D 62/393 |
| 2024/0145249 A1* | 5/2024 | Chen | H10D 84/0172 |
| 2025/0056866 A1* | 2/2025 | Liaw | H10D 84/85 |
| 2025/0169133 A1* | 5/2025 | Kim | H10D 30/43 |

OTHER PUBLICATIONS

Migita et al., "Electrical Performances of Junctionless-FETs at the Scaling Limit (LCH=3nm)," IEDM12-191094, IEEE Xplore, 2012 IEEE, 4 pages.
Weber et al., "A Novel Locally Engineered (111) V-channel pMOSTFET Architecture with Improved Drivability Characteristics for Low-Standby power (LSTP) CMOS Applications," 2005 Symposium on VLSI Technology Digest of Technical Papers, pp. 156-157, 2 pages.

* cited by examiner

IC STRUCTURE WITH GATE ELECTRODE FULLY WITHIN V-SHAPED CAVITY

BACKGROUND

The present disclosure relates to integrated circuit (IC) structures and, more particularly, to an IC structure including a switch with a gate electrode fully within a V-shaped cavity.

IC structures, such as low noise amplifiers, include switches having V-shaped gates that allow for smaller gate width.

SUMMARY

An aspect of the disclosure provides an integrated circuit (IC) structure, comprising: a V-shaped cavity in a semiconductor substrate; a source region and a drain region on opposing sides of the V-shaped cavity; and a gate structure fully within the V-shaped cavity, the gate structure including a gate dielectric layer, spacers, and a gate electrode on the gate dielectric layer between the spacers.

An aspect of the disclosure provides an integrated circuit (IC) structure, comprising: a V-shaped cavity in a semiconductor substrate; a source region and a drain region on opposing sides of the V-shaped cavity; and a gate structure including a gate dielectric layer, spacers, and a gate electrode on the gate dielectric layer between the spacers, wherein the gate electrode has substantially vertical sides and a V-shaped bottom surface corresponding to a surface of the gate dielectric layer on a lower portion of the V-shaped cavity, and an upper surface of the gate electrode and an upper surface of the spacers are coplanar with an upper surface of the semiconductor substrate.

An aspect of the disclosure provides a method comprising: forming a V-shaped cavity in a semiconductor substrate; filling the V-shaped cavity with a spacer material; forming an opening in the spacer material, creating two spacers and exposing a surface of a lower portion of the V-shaped cavity; forming a gate dielectric layer on the surface of the lower portion of the V-shaped cavity; forming a gate electrode over the gate dielectric layer and between the spacers, wherein the gate electrode between the spacers, the spacers and the gate dielectric layer are fully within the V-shaped cavity; and forming a source region and a drain region on opposing sides of the V-shaped cavity.

BRIEF DESCRIPTION OF THE DRAWINGS

The embodiments of this disclosure will be described in detail, with reference to the following figures, wherein like designations denote like elements, and wherein:

FIGS. 2-6 show cross-sectional views of a method of forming the IC structure, according to embodiments of the disclosure.

Figure 1:
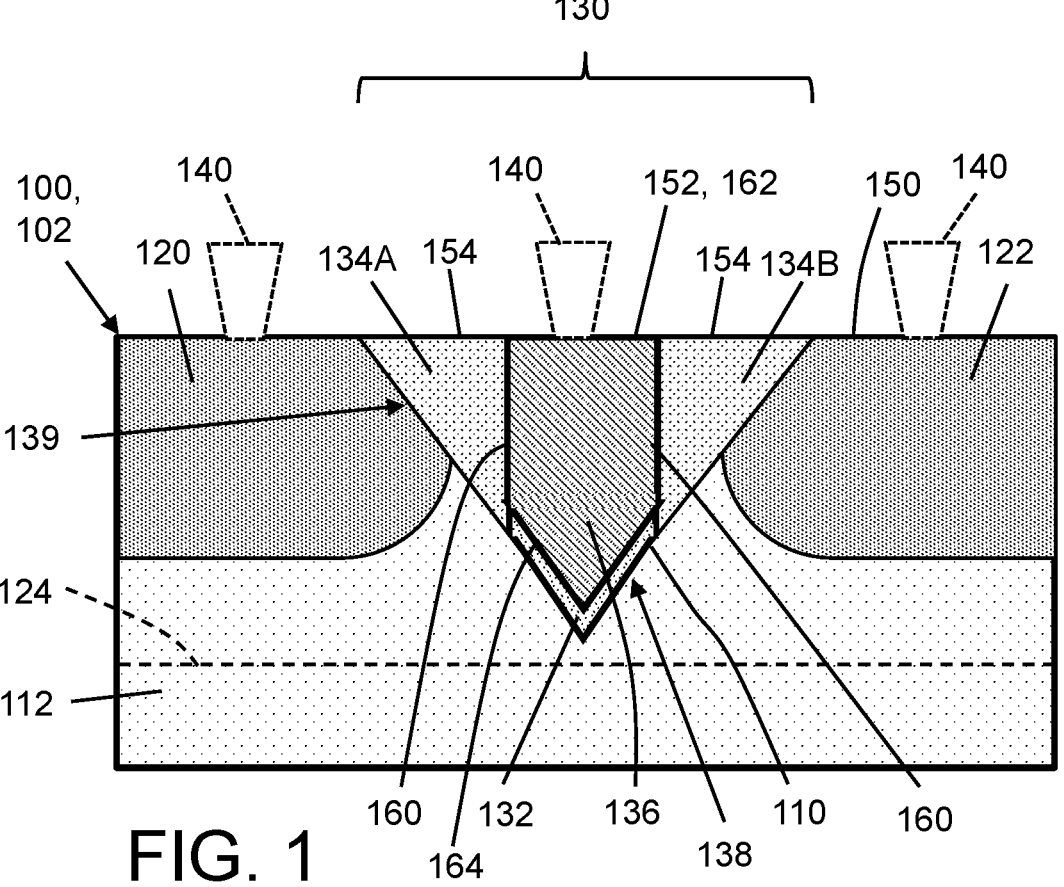
FIG. 1 shows a cross-sectional view of an IC structure, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (A) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide an integrated circuit (IC) structure including a V-shaped cavity in a semiconductor substrate. A source region and a drain region are on opposing sides of the V-shaped cavity. A gate structure includes a gate dielectric layer, spacers, and a gate electrode on the gate dielectric layer between the spacers. The gate structure is fully within the V-shaped cavity. The IC structure provides a switch that finds advantageous application as part of a low noise amplifier. The IC structure provides a smaller gate width, decreased capacitance, increased gain and increased radio frequency (RF) performance compared to planar devices or devices without the gate structure fully within V-shaped cavity.

FIG. 1 shows a cross-sectional view of an IC structure 100 according to embodiments of the disclosure. IC structure 100 includes a switch 102 that, as will be described, may be configured as a low noise amplifier (LNA), e.g., as part of an LNA application. IC structure includes a V-shaped cavity 110 in a semiconductor substrate 112. Semiconductor substrate 112 typically includes a wafer of semiconductor material such as silicon, germanium, silicon germanium, or silicon carbide. A substrate 112 may also comprise an organic semiconductor or a layered semiconductor such as, for example, Si/SiGe, a silicon-on-insulator or a SiGe-on-insulator. A portion or entire semiconductor substrate 112 may be amorphous, polycrystalline, or monocrystalline. In this example, semiconductor substrate 112 may include bulk semiconductor, but other forms of substrate may also be possible. Semiconductor substrate 112 may optionally include any desired dopant to customize the electrical properties thereof for the type of switch 102, e.g., PFET or NFET, to be provided by IC structure 100. V-shaped cavity 110 may include facets along (111) crystallographic planes of semiconductor substrate 112.

IC structure 100 also includes a source region 120 and a drain region 122 on opposing sides of V-shaped cavity 110. Source and drain regions 120, 122 may include any appropriate dopants for the type of switch 102 to be formed, e.g., n-type or p-type dopants. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped with a Group V dopant, such as arsenic (As), phosphorous (P) or antimony (Sb), to achieve N-type conductivity. IC structure 100 may also include any variety of additional doping regions 124 in semiconductor substrate 112 underneath spacers 134A-B (described herein) and source region 120 and drain region 122. Doped regions 124 may include any now known or later developed regions of additional dopant(s) to provide desired electrical properties for IC structure 100 such as but not limited to doped wells (example shown by dashed lines), halos, or extensions.

IC structure 100 also includes a gate structure 130 fully within V-shaped cavity 110. Gate structure 130 includes a gate dielectric layer 132, spacers 134A, 134B, and a gate electrode 136 on gate dielectric layer 132 between spacers 134A, 134B. Gate electrode 136 may include any now known or later developed polyconductor, e.g., polysilicon or metal gate material. Gate dielectric layer 132 has a different material composition than spacers 134A-B, e.g., with different dielectric constants. In one example, spacers 134A-B include at least one nitride such as silicon nitride and/or other nitrides, and gate dielectric layer 132 includes an oxide such as silicon oxide. Gate dielectric layer 132 contacts a surface of a lower portion 138 of V-shaped cavity 110 and is between spacers 134A-B. Spacers 134A-B contact a surface of an upper portion 139 of V-shaped cavity 110.

IC structure 100 may also include any variety of metallic interconnect 140 on gate electrode 136, source region 120 and/or drain region 122. Metallic interconnects 140 may include any now known or later developed metal wire or contact formed in an inter-layer dielectric (ILD) layer (not shown) over substrate 112.

In contrast to conventional recessed gate devices, gate structure 130 is fully within V-shaped cavity 110, i.e., none of gate structure 130 extends beyond an upper surface 150 of semiconductor substrate 112. More particularly, an upper surface 152 of gate electrode 136 and an upper surface 154 of spacers 134A-B are coplanar with upper surface 150 of semiconductor substrate 112. However, gate electrode 136 does not fully fill V-shape cavity 110. Rather, gate electrode 136 has a shape of an irregular pentagon with two parallel sides 160, each side 160 perpendicular to a base 162, i.e., same side as upper surface 152. Spacers 134A-B contact the two parallel sides 160 of gate electrode 136 and a surface of upper portion 139 of V-shaped cavity 110. Gate electrode

136 may also be stated to have a shape of a rectangle with a coincident isosceles triangle placed on one side, or an isosceles right pentagon. In this regard, gate electrode 136 has substantially vertical sides 160 and a V-shaped bottom surface 164 corresponding to an upper surface of gate dielectric layer 132 on lower portion 138 of V-shaped cavity 110. As used herein, "substantially vertical" indicates with approximately +/−10° of vertical. Spacers 134A-B contact the substantially vertical sides 160 of gate electrode 136 and a surface of upper portion 139 of V-shaped cavity 110. As observed in FIG. 1, gate dielectric layer 132, gate electrode 136 and spacers 134A-B fully fill V-shaped cavity 110.

Figures 2, 3:
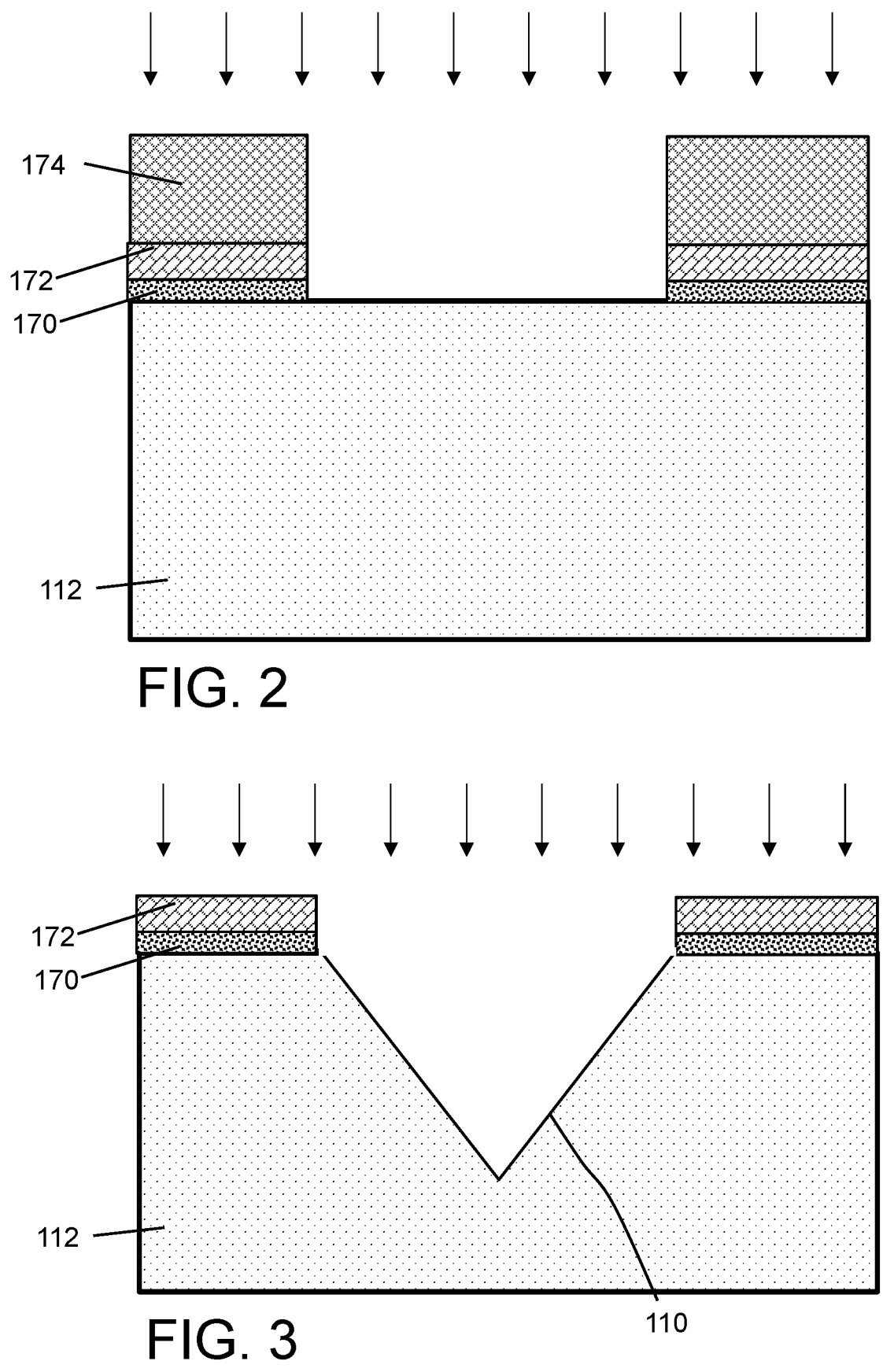

FIGS. 2-6 show cross-sectional views of a method according to embodiments of the disclosure. The method may form IC structure 100 (FIG. 1). FIGS. 2 and 3 show forming V-shaped cavity 110 in semiconductor substrate 112. At this stage, any trench isolations (not shown) may be formed to electrically isolate different regions within substrate in a known fashion. The forming of V-shaped cavity 110 may include, as shown in FIG. 2, patterning a nitride layer 170 and a pad oxide layer 172 thereunder using a patterned mask 174 and an etching to remove the layers 170, 172 over substrate 112, e.g., using a reactive ion etch (RIE). Mask 174 may include any now known or later developed masking material appropriate for the etching chemistry used. Common masking materials are photoresist (resist) and nitride. Nitride is usually considered to be a "hard mask." Mask 174 may include a developable organic planarization layer (OPL) on the layer to be etched, a developable anti-reflective coating (ARC) layer on the developable OPL, and a photoresist mask layer on the developable ARC layer. After the etching shown in FIG. 2, mask 174 may be removed using any known removal process appropriate for the mask material, e.g., a wet etch for hard nitride mask or an ashing process (oxygen dry strip process) for a soft resist-based mask. As shown in FIG. 3, patterned nitride layer 172 may then be used (as a mask) to form V-shaped cavity 110. V-shaped cavity 110 may be formed by performing any now known or later developed wet etching process appropriate for semiconductor substrate 112. As noted, V-shaped cavity 110 may include facets along (111) crystallographic planes of semiconductor substrate 112. After the etching shown in FIG. 3, nitride layer 172 may be removed using any known removal process appropriate for the mask material, e.g., a wet etch for hard nitride mask.

Figure 4:
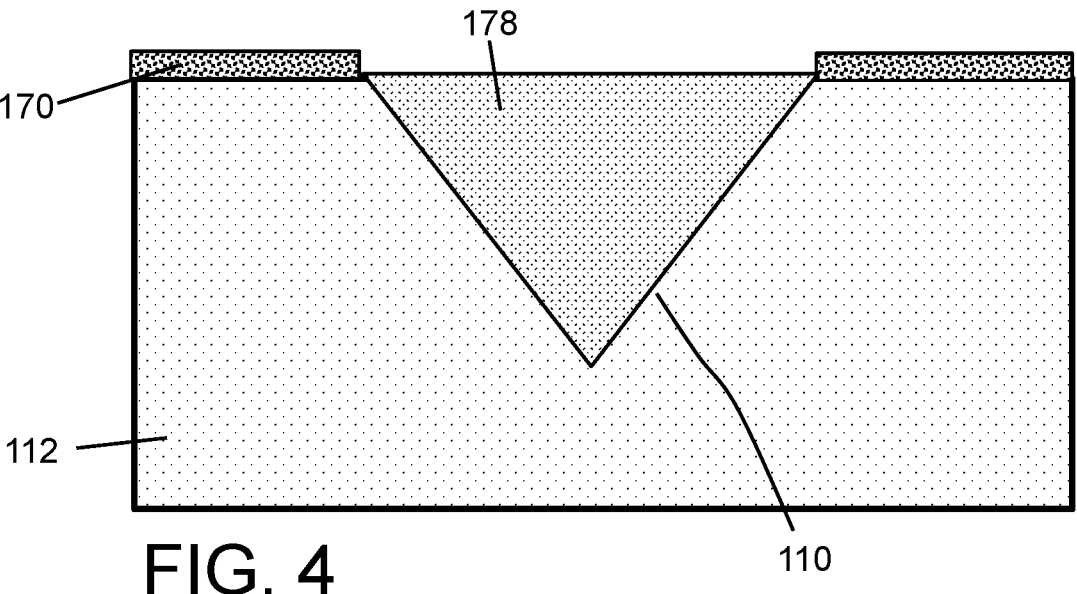

FIG. 4 shows filling V-shaped cavity 110 with a spacer material 178. Spacer material 178 may be deposited using any appropriate deposition technique for the material, such as but not limited to chemical vapor deposition of a nitride. Spacer material 178 may include any spacer material such as but not limited to at least one nitride such as silicon nitride and/or other nitride.

Figure 5:
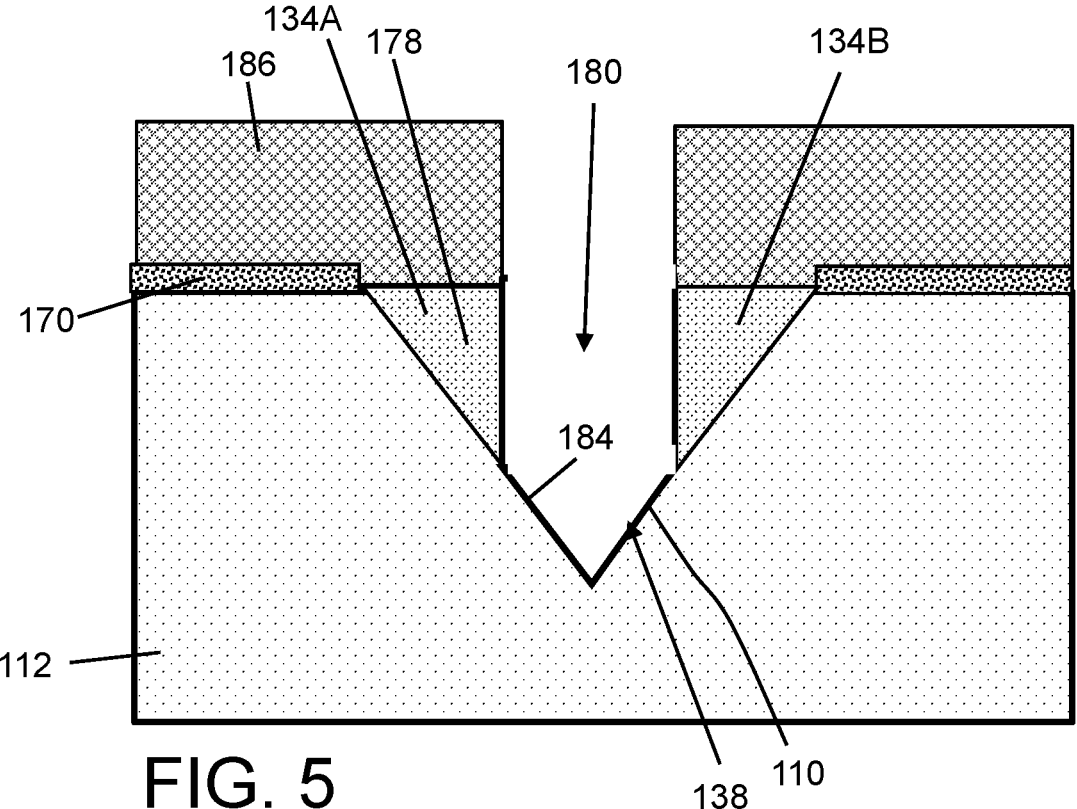

FIG. 5 shows forming an opening 180 in spacer material 178. Opening 180 creates two spacers 134A-B and exposes a surface 184 of lower portion 138 of V-shaped cavity 110. This process may include depositing and patterning a mask 186 and performing an etching such as a reactive ion etch (RIE) to create opening 180. Mask 186 may include any now known or later developed masking material appropriate for the etching chemistry used, and as previously described herein. After the etching, mask 186 may be removed using any known removal process appropriate for the mask material, as previously described.

Figure 6:
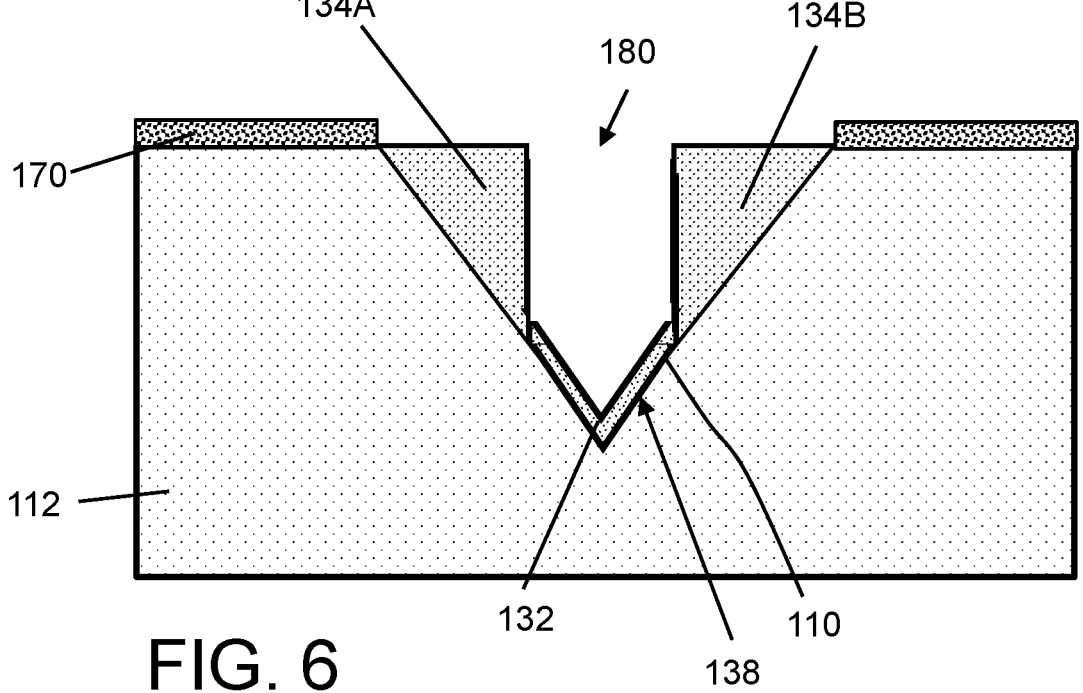

FIG. 6 shows forming gate dielectric layer 132 on surface 184 (FIG. 5) of lower portion 138 of V-shaped cavity 110. Gate dielectric layer 132 may be formed, for example, by thermally growing an oxide on surface 184 of lower portion 138 of V-shaped cavity 110. Gate dielectric layer 132 takes the shape of surface 184 of lower portion 138 of V-shaped cavity 110, and has a cross-sectional V-shape between spacers 134A-B.

FIG. 1 shows forming gate electrode 136 over gate dielectric layer 132 and between spacers 134A-B. The process may include depositing gate electrode 136 material, such as polysilicon using any appropriate deposition technique (e.g., CVD), and planarizing. The planarizing can include any appropriate planarization technique such as but not limited to chemical mechanical polishing. More particularly, forming gate electrode 136 may include depositing a polysilicon, and planarizing to make upper surface 152 of gate electrode 136 and upper surface 154 of spacers 134A-B coplanar with upper surface 150 of semiconductor substrate 112 (removing pad oxide layer 170 (FIG. 6)). As noted, gate electrode 136 is between spacers 134A-B. Further, gate electrode 136, spacers 134A-B and gate dielectric layer 132 are fully within V-shaped cavity 110, as previously described. Again, none of gate structure 130 extends beyond an upper surface 150 of semiconductor substrate 112. As noted, gate electrode 136 has a shape of an irregular pentagon with two parallel sides 160, each side 160 being perpendicular to base 162 (upper surface 152). Spacers 134A-B contact the two parallel sides 160 of gate electrode 136 and a surface of upper portion 139 of V-shaped cavity 110.

FIG. 1 also shows forming source region 120 and drain region 122 on opposing sides of V-shaped cavity 110. Source region 120 and drain region 122 may be formed using any now known or later developed doping process, such as but not limited to ion implantation. Metallic interconnects 140 can be formed using any now known or later developed middle-of-line or back-end-of-line processing.

Embodiments of the disclosure provide various technical and commercial advantages, examples of which are discussed herein. IC structure 100 provides a smaller gate width, decreased capacitance, increased gain and increased radio frequency (RF) performance compared to planar devices or devices without the gate structure fully within V-shaped cavity.

The structure and method as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−5% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure, comprising:
   a V-shaped cavity in a semiconductor substrate;
   a source region and a drain region on opposing sides of the V-shaped cavity; and
   a gate structure including a gate dielectric layer and spacers wherein a lower surface of each spacer is substantially coplanar with an adjacent lower surface of the gate structure, and the gate dielectric layer has a gate electrode on the gate dielectric layer between the spacers, wherein the gate dielectric layer includes a set of sidewalls and the gate electrode includes a set of sidewalls vertically aligned with the set of sidewalls of the gate dielectric layer.

2. The IC structure of claim 1, wherein an upper surface of the gate structure and an upper surface of the spacers are coplanar with an upper surface of the semiconductor substrate.

3. The IC structure of claim 1, wherein the gate electrode has substantially vertical sides and a V-shaped bottom surface corresponding to a surface of the gate dielectric layer on a lower portion of the V-shaped cavity.

4. The IC structure of claim 3, wherein the spacers contact the substantially vertical sides of the gate electrode and a surface of an upper portion of the V-shaped cavity.

5. The IC structure of claim 1, wherein the gate electrode has a shape of an irregular pentagon with two parallel sides, each side perpendicular to a base.

6. The IC structure of claim 5, wherein the spacers contact the two parallel sides of the gate electrode and a surface of an upper portion of the V-shaped cavity.

7. The IC structure of claim 1, wherein the gate dielectric layer has a different material composition than the spacers.

8. The IC structure of claim 1, wherein the V-shaped cavity includes facets along (111) crystallographic planes of the semiconductor substrate.

9. The IC structure of claim 1, further comprising doping regions in the semiconductor substrate underneath the spacers and the source region and the drain region.

10. The IC structure of claim 1, wherein the IC structure is configured as a low noise amplifier.

11. An integrated circuit (IC) structure, comprising:

a V-shaped cavity in a semiconductor substrate;

a source region and a drain region on opposing sides of the V-shaped cavity; and a gate structure including a gate dielectric layer and spacers, wherein a lower surface of each spacer is substantially coplanar with an adjacent lower surface of the gate structure, and the gate dielectric layer has a gate electrode on the gate dielectric layer between the spacers, wherein the gate electrode has substantially vertical sides and a V-shaped bottom surface corresponding to a surface of the gate dielectric layer on a lower portion of the V-shaped cavity, and an upper surface of the gate electrode and an upper surface of the spacers are coplanar with an upper surface of the semiconductor substrate.

12. The IC structure of claim 11, wherein the spacers contact the substantially vertical sides of the gate electrode and a surface of an upper portion of the V-shaped cavity.

13. The IC structure of claim 11, wherein the gate electrode has a shape of an irregular pentagon with two parallel sides, each side perpendicular to a base, and wherein the spacers contact the two parallel sides of the gate electrode and a surface of an upper portion of the V-shaped cavity.

14. A method comprising:

forming a V-shaped cavity in a semiconductor substrate;

filling the V-shaped cavity with a spacer material;

forming an opening in the spacer material, creating two spacers and exposing a surface of a lower portion of the V-shaped cavity;

forming a gate dielectric layer on the surface of the lower portion of the V-shaped cavity;

forming a gate electrode over the gate dielectric layer and between the two spacers, wherein each of the two spacers includes a lower surface substantially coplanar with an adjacent lower surface of the gate structure, and the gate electrode between the spacers, the spacers and the gate dielectric layer are fully within the V-shaped cavity, and wherein the gate electrode includes a set of sidewalls vertically aligned with a set of sidewalls of the gate dielectric layer; and forming a source region and a drain region on opposing sides of the V-shaped cavity.

15. The method of claim 14, wherein forming the gate electrode includes depositing a polysilicon, and planarizing to make an upper surface of the gate electrode and an upper surface of the spacers coplanar with an upper surface of the semiconductor substrate.

16. The method of claim 14, wherein the gate electrode has substantially vertical sides and a V-shaped bottom surface corresponding to a surface of the gate dielectric layer on a lower portion of the V-shaped cavity, and wherein the spacers contact the substantially vertical sides of the gate electrode and a surface of an upper portion of the V-shaped cavity.

17. The method of claim 14, wherein the gate electrode has a shape of an irregular pentagon with two parallel sides, each side perpendicular to a base, and the spacers contact the two parallel sides of the gate electrode and a surface of an upper portion of the V-shaped cavity.

18. The structure of claim 11, wherein the gate dielectric layer includes a set of sidewalls and the gate electrode includes a set of sidewalls vertically aligned with the set of sidewalls of the gate dielectric layer.

\* \* \* \* \*